United States Patent
Leipold et al.

(10) Patent No.: US 10,756,675 B2
(45) Date of Patent: Aug. 25, 2020

(54) BROADBAND POWER AMPLIFIER CIRCUIT

(71) Applicant: Qorvo US, Inc., Greensboro, NC (US)

(72) Inventors: Dirk Robert Walter Leipold, San Jose, CA (US); Baker Scott, San Jose, CA (US); Toshiaki Moriuchi, San Jose, CA (US); George Maxim, Saratoga, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/202,695

(22) Filed: Nov. 28, 2018

(65) Prior Publication Data

US 2020/0169223 A1 May 28, 2020

(51) Int. Cl.
*H03F 1/02* (2006.01)
*H03F 3/21* (2006.01)
*H03F 3/19* (2006.01)
*H03G 3/30* (2006.01)

(52) U.S. Cl.
CPC .......... *H03F 1/0227* (2013.01); *H03F 3/19* (2013.01); *H03F 3/21* (2013.01); *H03G 3/3042* (2013.01); *H03F 2200/451* (2013.01); *H03G 2201/103* (2013.01); *H03G 2201/208* (2013.01); *H03G 2201/307* (2013.01)

(58) Field of Classification Search
CPC .................................................... H03F 1/0227
USPC ........................................................ 330/279
See application file for complete search history.

(56) References Cited

U.S. PATENT DOCUMENTS

| | | | | |
|---|---|---|---|---|
| 7,863,984 B1* | 1/2011 | Behnke | ..................... | H03F 3/19 330/285 |
| 2013/0033314 A1* | 2/2013 | Gudem | ................ | H03F 1/0255 330/96 |
| 2014/0070881 A1* | 3/2014 | Annes | .................. | H03F 1/0288 330/2 |
| 2014/0232457 A1* | 8/2014 | Dhanasekaran | .......... | H03F 3/45 330/69 |
| 2014/0292404 A1* | 10/2014 | Geng | .................... | H03F 1/3241 330/149 |
| 2014/0355717 A1* | 12/2014 | Lu | ......................... | H03F 1/0211 375/300 |

* cited by examiner

*Primary Examiner* — Patricia T Nguyen
(74) *Attorney, Agent, or Firm* — Withrow & Terranova, P.L.L.C.

(57) ABSTRACT

A broadband power amplifier circuit is provided. The broadband power amplifier circuit includes an amplifier circuit configured to amplify a radio frequency (RF) signal to an output power based on a bias voltage and a supply voltage. Given that the output power of the RF signal may rise and fall from time to time, the broadband power amplifier circuit is configured to opportunistically increase or decrease the bias voltage in a defined future time (e.g., a future time slot or a future symbol duration) based on the output power in the defined future time. When necessary, the broadband power amplifier may be further configured to adjust the supply voltage and/or attenuate the RF signal based on the output power. As such, it may be possible to maintain class-A operation mode for the amplifier circuit. As a result, the amplifier circuit may maintain linearity and avoid memory effect with improved efficiency.

20 Claims, 6 Drawing Sheets

BROADBAND POWER AMPLIFIER CIRCUIT

FIELD OF THE DISCLOSURE

The technology of the disclosure relates generally to a power amplifier circuit.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience depends on higher data rates offered by new generation wireless communication systems such as a fifth-generation (5G) system. The new generation wireless communication systems typically employ linear modulation schemes, such as quadrature amplitude modulation (QAM), in conjunction with orthogonal frequency division multiplexing (OFDM) and broad bandwidth (e.g., ≥400 MHz) for achieving the higher data rates and spectrum efficiency. Accordingly, a wireless communication signal communicated in the new generation wireless communication system can correspond to a nonconstant amplitude envelope and exhibit higher peak-to-average ratio (PAR). Generally speaking, the higher the data rate the wireless communication signal can achieve, the higher the PAR the wireless communication signal will exhibit.

To achieve the higher data rates and desirable coverage range, the mobile communication device typically employs a broadband power amplifier (PA) to increase output power of the wireless communication signal to maintain sufficient energy per bit and/or desirable signal-to-noise ratio (SNR). Notably, a higher peak associated with the wireless communication signal can cause the broadband PA to move toward compression that can lead to undesirable out-of-band spectral regrowth and in-band distortion. As such, the broadband PA may be configured to operate with a sufficient back-off (e.g., in class-A mode) from the peak to help improve linearity performance of the PA. However, the improved linearity performance is often achieved at the expense of reduced PA efficiency. For example, a wireless communication signal communicated in the 5G system can exhibit a PAR as high as 11 dB. In this regard, it may be necessary to configure a 5G PA to operate with 11 dB back-off. As a result, the 5G PA may be forced to operate at as low as 5% PA efficiency.

Although it may be possible to improve PA efficiency by configuring the PA to operate in a class-AB mode, such an approach can also compromise the linearity performance of the PA. Moreover, the PA may suffer so-called memory effect, in which an instantaneous output power of the PA depends not only on an instantaneous input power of the PA, but also on the historical input powers of the PA. As such, it may be desirable to achieve a good balance between PA linearity and PA efficiency in a broadband PA, while avoiding the so-called memory effect in the broadband PA.

SUMMARY

Embodiments of the disclosure relate to a broadband power amplifier circuit. The broadband power amplifier circuit includes an amplifier circuit configured to amplify a radio frequency (RF) signal to an output power based on a bias voltage and a supply voltage. In examples discussed herein, the RF signal can be a broadband signal modulated at a wider bandwidth (e.g., ≥400 MHz) and corresponding to a higher peak-to-average ratio (PAR) (e.g., ≥11 dB). Accordingly, the output power of the RF signal may rise and fall from time to time. In this regard, the broadband power amplifier circuit is configured to opportunistically increase or decrease the bias voltage in a defined future time (e.g., a future time slot or future symbol duration) based on the output power in the defined future time. When necessary, the broadband power amplifier may be further configured to adjust the supply voltage and/or attenuate the RF signal based on the output power. As such, it may be possible to maintain a class-A operation mode for the amplifier circuit. As a result, the amplifier circuit may maintain linearity and avoid memory effect with improved efficiency.

In one aspect, a broadband power amplifier circuit is provided. The broadband power amplifier circuit includes an amplifier circuit configured to amplify an RF signal from an input power to an output power based on a bias voltage and a supply voltage. The broadband power amplifier circuit also includes an amplifier control circuit coupled to the amplifier circuit. The broadband power amplifier circuit also includes a main control circuit. The main control circuit is configured to receive a power indication signal indicative of the output power of the RF signal in a defined future time. The main control circuit is also configured to determine an estimated bias voltage in the defined future time based on the output power indicated by the power indication signal. The main control circuit is also configured to cause the amplifier control circuit to generate the bias voltage based on the estimated bias voltage and provide the bias voltage to the amplifier circuit in the defined future time.

In another aspect, a broadband power amplifier circuit is provided. The broadband power amplifier circuit includes an amplifier circuit configured to amplify an RF signal from an input power to an output power based on a bias voltage and a supply voltage. The broadband power amplifier circuit also includes an amplifier control circuit coupled to the amplifier circuit. The broadband power amplifier circuit also includes a main control circuit. The main control circuit is configured to receive a power indication signal indicative of the output power of the RF signal in a defined future time. The main control circuit is also configured to determine an estimated bias voltage in the defined future time based on the output power indicated by the power indication signal. The main control circuit is also configured to determine an estimated supply voltage in the defined future time based on the output power indicated by the power indication signal. The main control circuit is also configured to determine an estimated input power for the RF signal in the defined future time based on the output power indicated by the power indication signal. The main control circuit is also configured to cause the amplifier control circuit to generate the bias voltage based on the estimated bias voltage and provide the bias voltage to the amplifier circuit in the defined future time. The main control circuit is also configured to cause the amplifier control circuit to generate the supply voltage based on the estimated supply voltage and provide the supply voltage to the amplifier circuit. The main control circuit is also configured to cause the amplifier control circuit to adjust the input power of the RF signal to the estimated input power.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a broadband power amplifier circuit. The broadband power amplifier circuit includes an amplifier circuit configured to amplify a radio frequency (RF) signal to an output power based on a bias voltage and a supply voltage. In examples discussed herein, the RF signal can be a broadband signal modulated at a wider bandwidth (e.g., ≥400 MHz) and corresponding to a higher peak-to-average ratio (PAR) (e.g., ≥11 dB). Accordingly, the output power of the RF signal may rise and fall from time to time. In this regard, the broadband power amplifier circuit is configured to opportunistically increase or decrease the bias voltage in a defined future time (e.g., a future time slot or a future symbol duration) based on the output power in the defined future time. When necessary, the broadband power amplifier may be further configured to adjust the supply voltage and/or attenuate the RF signal based on the output power. As such, it may be possible to maintain class-A operation mode for the amplifier circuit. As a result, the amplifier circuit may maintain linearity and avoid memory effect with improved efficiency.

Before discussing the broadband power amplifier circuit of the present disclosure, a brief overview of an exemplary power amplifier is first provided with reference to FIGS. 1A-1E to help explain certain key characteristics and operational principles of the power amplifier. The discussion of specific exemplary aspects of a broadband power amplifier circuit according to the present disclosure starts below with reference to FIG. 2.

Figure 1A:
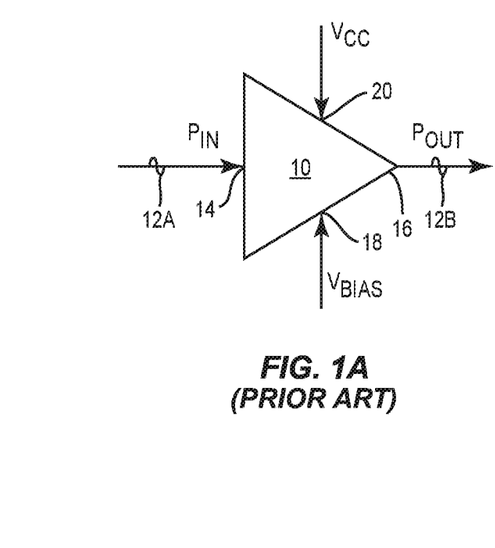
FIG. 1A is a schematic diagram of an exemplary power amplifier (PA)

FIG. 1A is a schematic diagram of an exemplary power amplifier 10. The power amplifier circuit 10 is configured to receive an RF input signal 12A at an input end 14 and output an RF output signal 12B at an output end 16. The power amplifier circuit 10 is also configured to receive a bias voltage $V_{BIAS}$ at a bias voltage input 18 and a supply voltage $V_{CC}$ at a supply voltage input 20. The power amplifier circuit 10 amplifies the RF input signal 12A having an input power $P_{IN}$ to generate the RF output signal 12B having an output power $P_{OUT}$ based on the bias voltage $V_{BIAS}$ and the supply voltage $V_{CC}$.

Figure 1B:
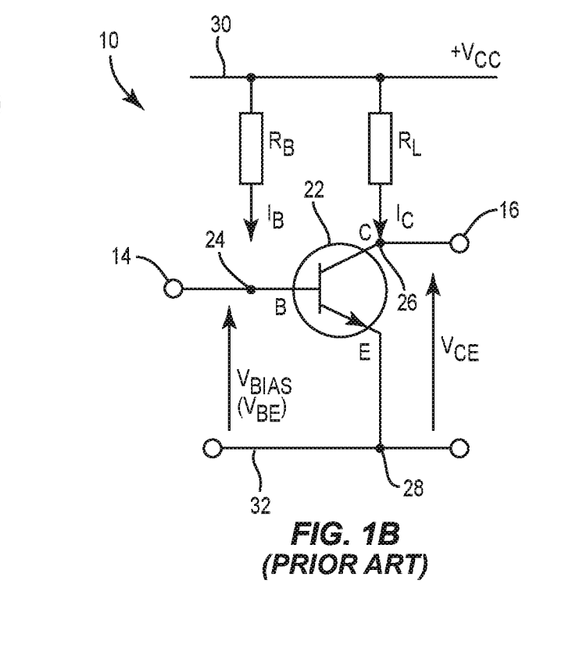
FIG. 1B is a schematic diagram providing an exemplary illustration of the power amplifier circuit of FIG. 1A implemented based on an N-type-P-type-N-type (NPN) transistor.

The power amplifier circuit 10 may be implemented based on an N-type-P-type-N-type (NPN) transistor(s) or a P-type-N-type-P-type (PNP) transistor(s). FIG. 1B is a schematic diagram providing an exemplary illustration of the power amplifier circuit 10 of FIG. 1A implemented based on an NPN transistor 22.

The NPN transistor 22 includes a base terminal 24 (abbreviated as "B"), a collector terminal 26 (abbreviated as "C"), and an emitter terminal 28 (abbreviated as "E"). The base terminal 24 is coupled to a supply rail 30 via a bias resistor $R_B$. The collector terminal 26 is coupled to the supply rail 30 via a load resistor $R_L$. The emitter terminal 28 is coupled to a ground rail 32.

The NPN transistor 22 receives the bias voltage $V_{BIAS}$ between the base terminal 24 and the emitter terminal 28. In this regard, the bias voltage $V_{BIAS}$ is equivalent to a base-emitter voltage $V_{BE}$. The supply voltage $V_{CC}$ is applied between the supply rail 30 and the ground rail 32. As such, the supply voltage $V_{CC}$ is equivalent to a collector-emitter voltage $V_{CE}$.

The NPN transistor 22 is in an active state when the base-emitter voltage $V_{BE}$ is greater than zero and less than the collector-emitter voltage $V_{CE}$ ($V_{CE} > V_{BE} > 0$). When the NPN transistor 22 is in the active state, a collector-emitter current $I_C$ is proportional to a base current $I_B$. In this regard, the NPN transistor 22 is in a linear state, thus causing the power amplifier circuit 10 to operate as a linear device.

The NPN transistor 22 is in a saturation state when the base-emitter voltage $V_{BE}$ is greater than the collector-emitter voltage $V_{CE}$ ($V_{BE} > V_{CE}$). When the NPN transistor 22 is in the saturation state, the NPN transistor 22 acts like a short circuit, thus allowing the collector-emitter current $I_c$ to flow freely from the collector terminal 26 to the emitter terminal 28. In this regard, the power amplifier circuit 10 produces a maximum collector-emitter current $I_C$.

The NPN transistor 22 is in a cut-off state when the collector-emitter voltage $V_{CE}$ is greater than the base-emitter voltage $V_{BE}$ ($V_{BE} < V_{CE}$). When the NPN transistor 22 is in the cut-off state, the NPN transistor 22 acts like an open circuit, thus preventing the collector-emitter current $I_c$ from flowing from the collector terminal 26 to the emitter terminal 28. In this regard, the collector-emitter current $I_C$ is at a minimum level.

Figure 1C:
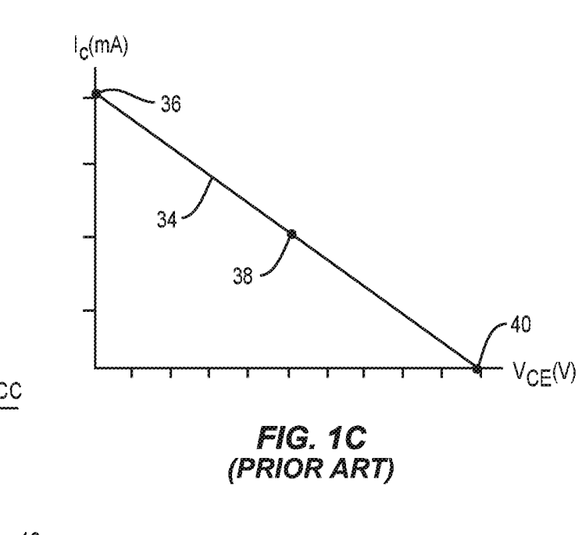
FIG. 1C is a graphic diagram providing an exemplary illustration of a load line corresponding to the power amplifier circuit of FIG. 1A.

The active state, the saturation state, and the cut-off state of the power amplifier circuit 10 can be further illustrated using a load line plot. In this regard, FIG. 1C is a graphic diagram providing an exemplary illustration of a load line 34 corresponding to the power amplifier circuit 10 of FIG. 1A. Elements of FIG. 1A are referenced in conjunction with FIG. 1C and will not be re-described herein.

The power amplifier circuit 10 can be configured to operate in different states by moving a bias point (also known as quiescent point or Q-point) of the power amplifier circuit 10 along the load line 34. The power amplifier circuit 10 operates in the saturation state when the Q-point of the power amplifier circuit 10 is set at a saturation point 36.

The power amplifier circuit 10 operates in the linear state when the Q-point of the power amplifier circuit 10 is set at a middle point 38 of the load line 34. Accordingly, the power amplifier circuit 10 can be said to operate in a class-A mode or referred to as a class-A power amplifier circuit.

The power amplifier circuit 10 operates in the cut-off state when the Q-point of the power amplifier circuit 10 is set at a cut-off point 40. Accordingly, the power amplifier circuit 10 can be said to operate in a class-B mode or referred to as a class-B power amplifier circuit.

In contrast, when the Q-point of the power amplifier circuit 10 is set in between the middle point 38 and the cut-off point 40 on the load line 34, the power amplifier circuit 10 can be said to operate in a class-AB mode or referred to as a class-AB power amplifier circuit.

Figure 1D:
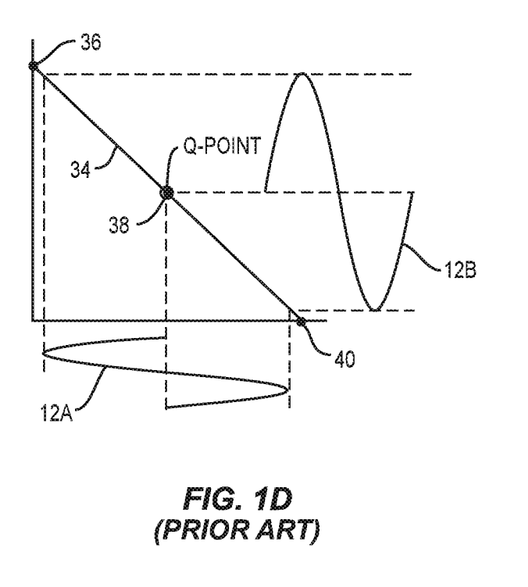
FIG. 1D is a graphic diagram providing an exemplary illustration of characteristics of the power amplifier circuit of FIG. 1A when operating as a class-A power amplifier circuit.

FIG. 1D is a graphic diagram providing an exemplary illustration of characteristics of the power amplifier circuit 10 of FIG. 1A when operating as a class-A power amplifier circuit. Common elements between FIGS. 1A, 1C, and 1D are shown therein with common element numbers and will not be re-described herein.

When the power amplifier circuit 10 is operating in the class-A mode, the Q-point of the power amplifier circuit 10 is set at the middle point 38 along the load line 34. In this regard, the power amplifier circuit 10 operates as a linear device and the RF output signal 12B is linearly proportional to the RF input signal 12A. Given that the power amplifier circuit 10 never drives the RF output signal 12B beyond the saturation point 36 and the cut-off point 40, the RF output signal 12B will not be compressed or clipped. As such, the power amplifier circuit 10 can effectively suppress out-of-band spectral regrowth and/or in-band interference. As a result, the power amplifier circuit 10 can operate with desirable adjacent channel power ratio (ACPR) and error vector magnitude (EVM). However, the improved linearity performance comes at the expense of reduced power amplifier efficiency (PAE). The PAE of the power amplifier circuit 10 is typically below 25% in the class-A mode.

In contrast, the power amplifier circuit 10 can achieve a highest possible PAE when operating in the class-B mode. However, in the class-B mode, the power amplifier circuit 10 will no longer operate as a linear device. As a result, the power amplifier circuit 10 can suffer a significant degradation in ACPR and EVM. In this regard, the class-AB mode is often seen as a trade-off configuration between the class-A mode and the class-B mode.

Figure 1E:
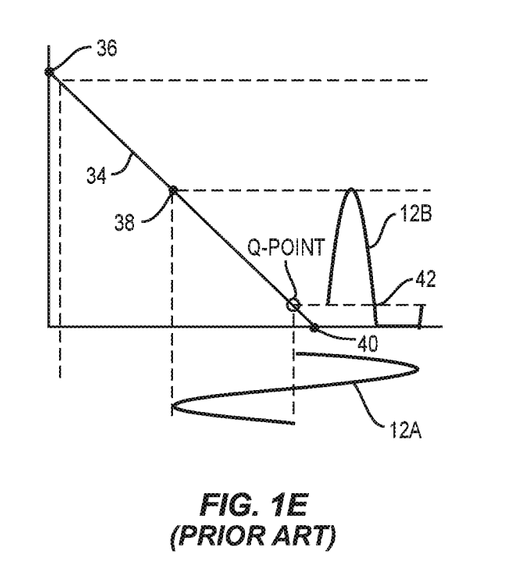
FIG. 1E is a graphic diagram providing an exemplary illustration of characteristics of the power amplifier circuit of FIG. 1A when operating as a class-AB power amplifier circuit.

FIG. 1E is a graphic diagram providing an exemplary illustration of characteristics of the power amplifier circuit 10 of FIG. 1A when operating as a class-AB power amplifier circuit. Common elements between FIGS. 1A, 1C, and 1E are shown therein with common element numbers and will not be re-described herein.

In the class-AB mode, the Q-point of the power amplifier circuit 10 is set in between the middle point 38 and the cut-off point 40 along the load line 34. In this regard, the power amplifier circuit 10 will neither offer the linearity performance of the class-A mode nor achieve the PAE of the class-B mode. As shown in FIG. 1E, the RF output signal 12B is no longer a replica of the RF input signal 12A due to amplitude clipping of the RF output signal 12B. Furthermore, the power amplifier circuit 10 can suffer the so-called memory effect when operating in the class-AB mode, particularly around a crossover point 42.

In summary, the power amplifier circuit 10 can provide improved PAE, but at the expense of worsened linearity, when the Q-point is moved from the middle point 38 toward the cut-off point 40 along the load line 34. However, given that the output power $P_{OUT}$ of the RF output signal 12B may rise and fall from time to time, it may be possible to opportunistically move the Q-point of the power amplifier circuit 10 toward the cut-off point 40 to improve the PAE of the power amplifier circuit 10.

As discussed in detail below, it may be possible to dynamically determine the bias voltage $V_{BIAS}$ for the power amplifier circuit 10 based on an estimated output power $P_{OUT}$ of the RF output signal 12B in a defined future time (e.g., a time slot or a symbol duration) and apply the determined bias voltage $V_{BIAS}$ to the power amplifier circuit 10 in the defined future time. In addition, it may also be possible to dynamically determine the supply voltage $V_{CC}$ based on the estimated output power $P_{OUT}$ of the RF output signal 12B in the defined future time and apply the determined supply voltage $V_{CC}$ to the power amplifier circuit 10 in the defined future time. Furthermore, it may also be possible to dynamically determine a gain adjustment step for the RF input signal 12A based on the estimated output power $P_{OUT}$ of the RF output signal 12B in the defined future time and adjust (increase or decrease) the input power $P_{IN}$ of the RF input signal 12A based on the determined gain adjustment step in the defined future time. By selectively controlling the bias voltage $V_{BIAS}$, the supply voltage $V_{CC}$, and/or the input power $P_{IN}$, it may be possible to opportunistically move the Q-point toward the cut-off point for an improvement in PAE, while keeping the power amplifier circuit 10 in the class-A mode. In this regard, it may be possible to improve the PAE of the power amplifier circuit 10 without sacrificing the linearity performance of the power amplifier circuit 10. By maintaining the linearity performance, it may be possible to avoid the so-called memory effect, thus allowing the power amplifier circuit 10 to operate in a "memory-free (MF)" mode. Hereinafter, a broadband power amplifier circuit configured according to the present disclosure is said to be operating in a "class-MF" mode.

Figure 2:
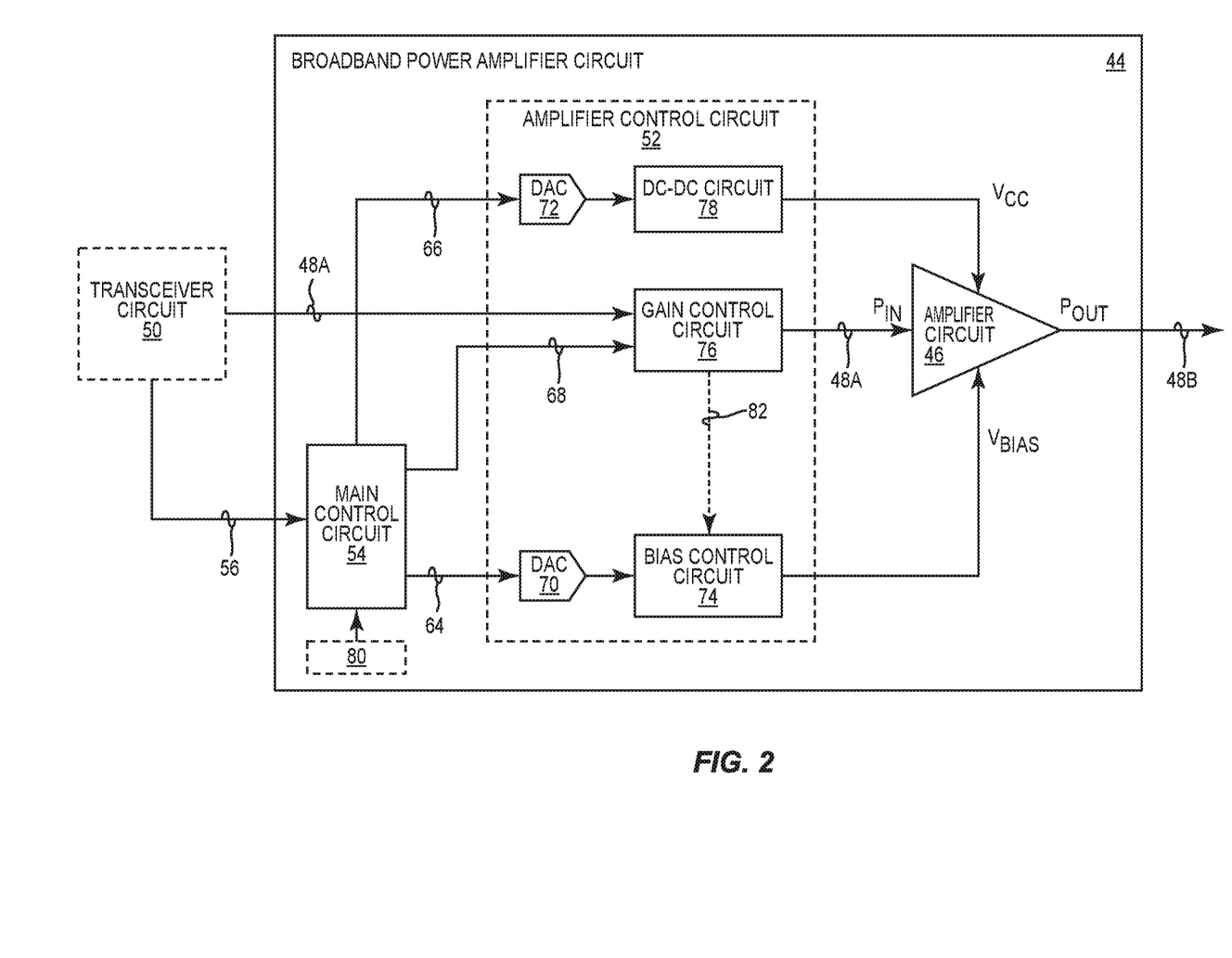
FIG. 2 is a schematic diagram of an exemplary broadband power amplifier circuit configured according to one embodiment of the present disclosure to operate in a class-memory-free (class-MF) mode.

In this regard, FIG. 2 is a schematic diagram of an exemplary broadband power amplifier circuit 44 configured according to one embodiment of the present disclosure to operate in a class-MF mode. The broadband power amplifier circuit 44 includes an amplifier circuit 46 configured to amplify an RF input signal 48A having an input power $P_{IN}$ to generate an RF output signal 48B having an output power $P_{OUT}$ based on a bias voltage $V_{BIAS}$ and a supply voltage $V_{CC}$. In a non-limiting example, the RF input signal 48A is received from a transceiver circuit 50, which modulates the RF input signal 48A at a broadband bandwidth (e.g., ≥400 MHz). Notably, the RF input signal 48A and the RF output signal 48B can be the same signal, but at different power levels. As such, the RF input signal 48A and the RF output signal 48B could be collectively referred to as an RF signal.

The broadband power amplifier circuit 44 includes an amplifier control circuit 52 coupled to the amplifier circuit 46. The broadband power amplifier circuit 44 also includes a main control circuit 54, which can be a digital signal processor (DSP) for example. The main control circuit 54 receives a power indication signal 56 (e.g., from the transceiver circuit 50) indicative of the output power $P_{OUT}$ of the RF output signal 48B in a defined future time (e.g., a future time slot or a future symbol duration). In a non-limiting example, the transceiver circuit 50 can estimate the output power $P_{OUT}$ of the RF output signal 48B based on a time-variant envelope that indicates the input power $P_{IN}$ of the RF input signal 48A. The main control circuit 54 is configured to determine an estimated bias voltage in the defined future time based on the output power $P_{OUT}$ indicated by the power indication signal 56. Accordingly, the main control circuit 54 causes the amplifier control circuit 52 to generate the bias voltage $V_{BIAS}$ based on the estimated bias voltage and provide the determined bias voltage $V_{BIAS}$ to the amplifier circuit 46 in the defined future time. By determining and applying the bias voltage $V_{BIAS}$ based on the output power $P_{OUT}$, it may be possible to dynamically boost efficiency of the amplifier circuit 46 without compromising linearity performance of the amplifier circuit 46.

Figure 3:
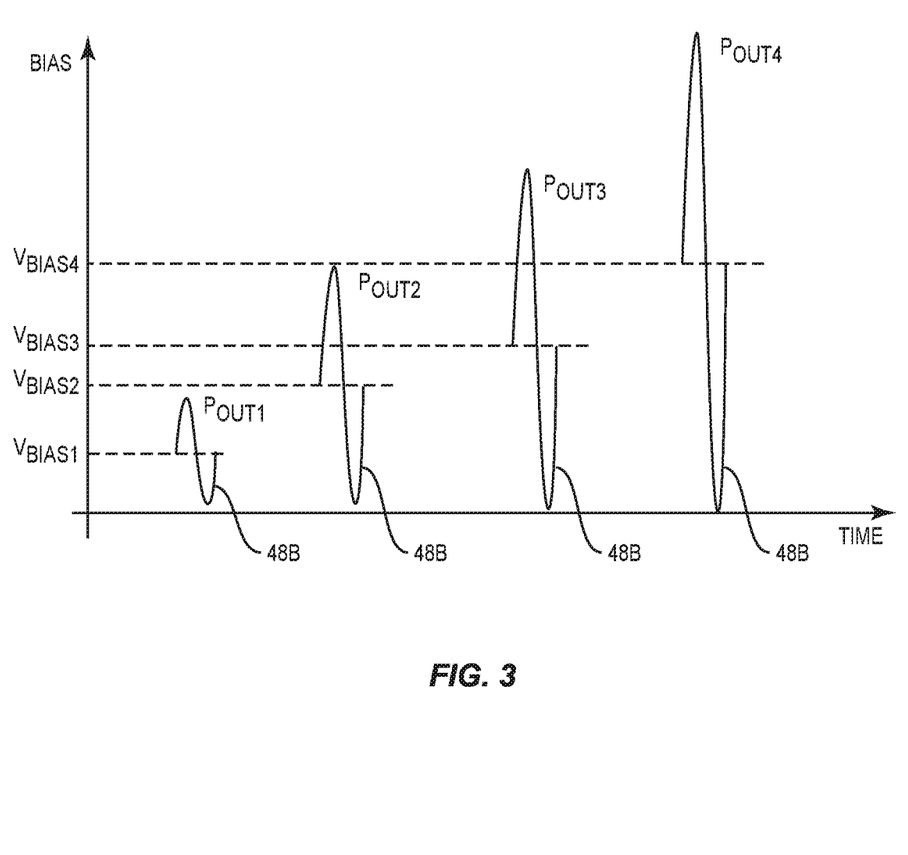
FIG. 3 is a graphic diagram providing exemplary illustrations of a number of bias voltages corresponding to different output power levels.

FIG. 3 is a graphic diagram providing exemplary illustrations of a number of bias voltages corresponding to different output power levels of the RF output signal 48B of FIG. 2. As shown in FIG. 3, the amplifier circuit 46 is biased at bias voltages $V_{BIAS1}$, $V_{BIAS2}$, $V_{BIAS3}$, and $V_{BIAS4}$ in response to the RF output signal 48B being amplified to the output powers $P_{OUT1}$, $P_{OUT2}$, $P_{OUT3}$, and $P_{OUT4}$ in the defined future time, respectively. By determining the bias voltages $V_{BIAS1}$, $V_{BIAS2}$, $V_{BIAS3}$, and $V_{BIAS4}$ in accordance to the estimated output powers $P_{OUT1}$, $P_{OUT2}$, $P_{OUT3}$, and $P_{OUT4}$, it may be possible to keep the amplifier circuit 46 in the class-A mode. As such, the RF output signal 48B may not be distorted due to amplitude clipping. Accordingly, the amplifier circuit 46 can operate in the class-MF mode with good linearity and the best-possible PAE.

Figure 4:
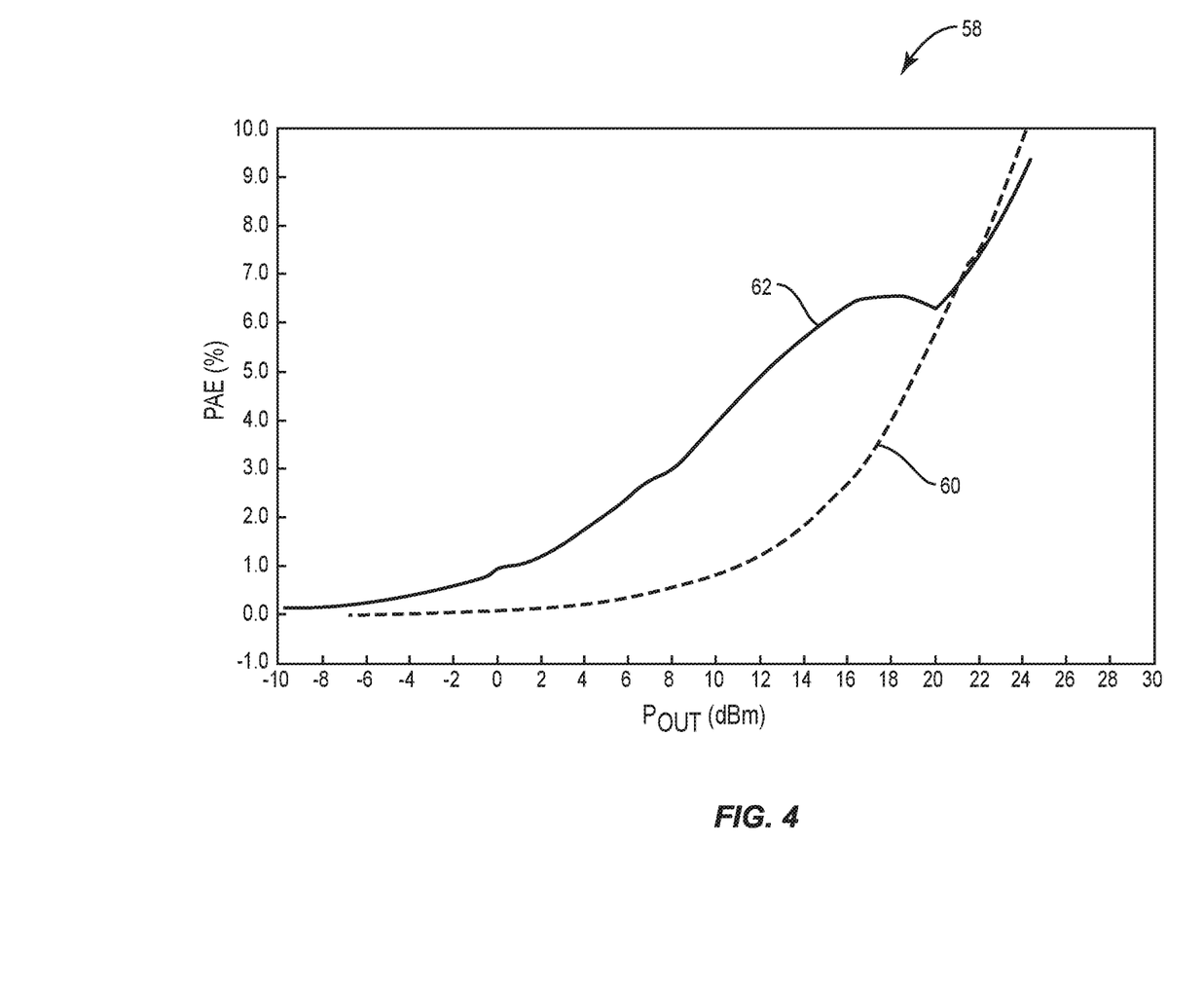
FIG. 4 is a graphic diagram providing an exemplary illustration of power amplifier efficiency (PAE) improvement provided by an amplifier circuit in the broadband power amplifier circuit of FIG. 2 over the power amplifier circuit of FIG. 1A.

FIG. 4 is a graphic diagram 58 providing an exemplary illustration of PAE improvement provided by the amplifier circuit 46 of FIG. 2 over the power amplifier circuit 10 of FIG. 1A. The graphic diagram 58 includes a first PAE curve 60 corresponding to PAEs of the power amplifier circuit 10 of FIG. 1A. The graphic diagram 58 includes a second PAE curve 62 corresponding to PAEs of the amplifier circuit 46 in the broadband power amplifier circuit 44 of FIG. 2. As shown in FIG. 4, the amplifier circuit 46 operates at a higher PAE over the power amplifier circuit 10 when the output power $P_{OUT}$ is below 20 dBm.

With reference back to FIG. 2, the main control circuit 54 may also be configured to determine an estimated supply voltage in the defined future time based on the output power $P_{OUT}$ indicated by the power indication signal 56. Accordingly, the main control circuit 54 may cause the amplifier control circuit 52 to generate the supply voltage $V_{CC}$ based on the estimated supply voltage and provide the determined supply voltage $V_{CC}$ to the amplifier circuit 46 in the defined future time.

The main control circuit 54 may also be configured to determine an estimated input power in the defined future time based on the output power $P_{OUT}$ of the RF output signal 48B indicated by the power indication signal 56. Accordingly, the main control circuit 54 may cause the amplifier control circuit 52 to adjust the input power $P_{IN}$ of the RF input signal 48A to the estimated input power in the defined future time. By adjusting the input power $P_{IN}$, it may be possible to correct amplitude overshoot of the RF output signal 48B, thus helping to avoid soft-compression in the RF output signal 48B.

Notably, the main control circuit 54 may dynamically determine the most appropriate configuration for the amplifier circuit 46 to keep the amplifier circuit 46 operating in the class-MF mode. In one example, the main control circuit 54 is configured to cause the amplifier control circuit to only adjust the bias voltage $V_{BIAS}$ in the defined future time. In another example, the main control circuit 54 is configured to cause the amplifier control circuit to adjust the bias voltage $V_{BIAS}$ and the supply voltage $V_{CC}$ in the defined future time. In another example, the main control circuit 54 is configured to cause the amplifier control circuit to adjust the bias voltage $V_{BIAS}$ and the input power $P_{IN}$ in the defined future time. In another example, the main control circuit 54 is configured to cause the amplifier control circuit to adjust the bias voltage $V_{BIAS}$, the supply voltage $V_{CC}$, and the input power $P_{IN}$ in the defined future time. In yet another example, the main control circuit 54 is configured to cause the amplifier control circuit to adjust the supply voltage $V_{CC}$ and the input power $P_{IN}$ in the defined future time, without adjusting the bias voltage $V_{BIAS}$.

The main control circuit 54 may determine the estimated bias voltage, the estimated supply voltage, and the gain adjustment step based on a first polynomial, a second polynomial, and a third polynomial, respectively. In one non-limiting example, each of the first polynomial, the second polynomial, and the third polynomial is a linear polynomial configured to be a function of the output power $P_{OUT}$ in the defined future time. In another non-limiting example, each of the first polynomial, the second polynomial, and the third polynomial is a nonlinear polynomial configured to be a function of the output power $P_{OUT}$ in the defined future time.

In a non-limiting example, the main control circuit 54 is configured to determine a digitized estimated bias voltage and a digitized estimated supply voltage in the defined future time based on the output power $P_{OUT}$ indicated by the power indication signal 56. The main control circuit 54 may be configured to provide a first control signal 64, a second control signal 66, and a third control signal 68 to the amplifier control circuit 52. The first control signal 64 is indicative of the digitized estimated bias voltage. The second control signal 66 is indicative of the digitized estimated supply voltage. The third control signal 68 is indicative of the estimated input power.

The amplifier control circuit 52 may be configured to include a first digital-to-analog converter (DAC) 70, a second DAC 72, a bias control circuit 74, a gain control circuit 76, and a direct-current (DC) to direct-current (DC) (DC-DC) circuit 78. The first DAC 70 is configured to receive the first control signal 64 and convert the digitized estimated bias voltage into the estimated bias voltage in the defined future time. Notably, the first DAC 70 needs to be a high-speed DAC such that the first DAC 70 can produce the estimated bias voltage between such intervals as symbol durations. The bias control circuit 74 is coupled to the first DAC 70 and the amplifier circuit 46. The bias control circuit 74 is configured to receive the estimated bias voltage from the first DAC 70. The bias control circuit 74 is further configured to generate the bias voltage $V_{BET}$ based on the estimated bias voltage and provide the bias voltage $V_{BET}$ to the amplifier circuit 46 in the defined future time.

The second DAC 72 is configured to receive the second control signal 66 and convert the digitized estimated supply voltage into the estimated supply voltage in the defined future time. Notably, the second DAC 72 needs to be a high-speed DAC such that the second DAC 72 can produce the estimated supply voltage between such intervals as symbol durations. The DC-DC circuit 78 is coupled to the second DAC 72 and the amplifier circuit 46. The DC-DC circuit 78 is configured to receive the estimated supply voltage from the second DAC 72. Accordingly, the DC-DC circuit 78 generates the supply voltage $V_{CC}$ based on the estimated supply voltage and provide the supply voltage $V_{CC}$ to the amplifier circuit 46 in the defined future time. In one non-limiting example, the DC-DC circuit 78 can generate the supply voltage $V_{CC}$ as an average power tracking (APT) modulated supply voltage. In another non-limiting example, the DC-DC circuit 78 can generate the supply voltage $V_{CC}$ as an envelope tracking (ET) modulated supply voltage. The DC-DC circuit 78 may be configured to generate the ET modulated supply voltage when the RF input signal 48A is modulated below a defined bandwidth (e.g., ≤100 MHz) and to generate the APT modulated supply voltage when the RF input signal 48A is modulated above the defined bandwidth (e.g., >100 MHz).

The gain control circuit 76 is configured to receive the third control signal 68. Accordingly, the gain control circuit 76 adjusts the input power $P_{IN}$ of the RF input signal 48A to the estimated input power indicated by the third control signal 68. The gain control circuit 76 may be configured to adjust the input power $P_{IN}$ of the RF input signal 48A to the estimated input power in one or more iterations based on a predefined coarse gain adjustment step. In a non-limiting example, the predetermined coarse gain adjustment step may be stored in a storage medium 80 (e.g., eFUSE) during a calibration process. The main control circuit 54 may provide the predetermined coarse gain adjustment step to the gain control circuit 76 in the third control signal 68.

For example, the main control circuit 54 determines that it is necessary to reduce the input power $P_{IN}$ of the RF input signal 48A from 18.8 dBm to the estimated input power of 18 dBm. The predetermined coarse gain adjustment step as stored in the storage medium 80 is 0.5 dBm. In this regard, the main control circuit 54 communicates the estimated input power (18 dBm) and the predetermined coarse gain adjustment step (0.5 dBm) to the gain control circuit 76 in the third control signal 68. The gain control circuit 76 thus attenuates the RF input signal 48A in two iterations based on the predetermined coarse gain adjustment step. As a result, the RF input signal 48A has an actual input power $P_{IN}$ of 17.8 dBm.

In this regard, there exists a gain error of 0.2 dBm between the estimated input power (18 dBm) and the actual input power $P_{IN}$ (17.8 dBm). As such, the gain control circuit 76 may be configured to provide a gain error signal 82 indicative of the gain error to the bias control circuit 74. Accordingly, the bias control circuit 74 may adjust the bias voltage $V_{BIAS}$ to compensate for the gain error, thus helping to ensure a smother gain of the amplifier circuit 46.

Figure 5:
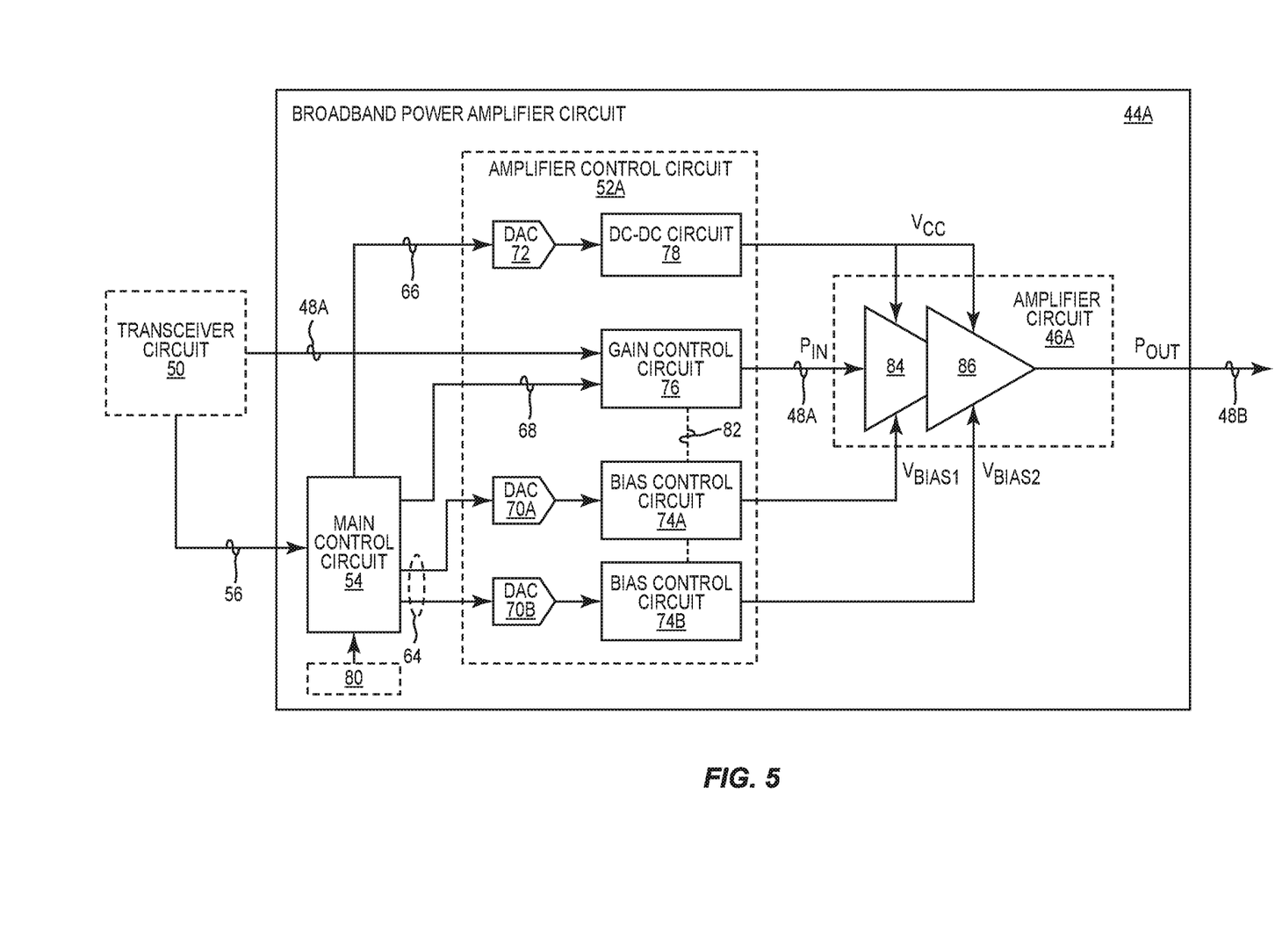
FIG. 5 is a schematic diagram of an exemplary broadband power amplifier circuit configured according to another embodiment of the present disclosure to support a multi-stage amplifier circuit.

The amplifier circuit 46 may be implemented as a multi-stage amplifier circuit. In this regard, FIG. 5 is a schematic diagram of an exemplary broadband power amplifier circuit 44A configured according to another embodiment of the present disclosure to support a multi-stage amplifier circuit 46A. Common elements between FIGS. 2 and 5 are shown therein with common element numbers and will not be re-described herein.

The multi-stage amplifier circuit 46A includes a driver stage amplifier 84 and an output stage amplifier 86. The driver stage amplifier 84 and the output stage amplifier 86 both receive the supply voltage $V_{CC}$. The driver stage amplifier 84 and the output stage amplifier 86 are driven by a first bias voltage $V_{BIAS1}$ and a second bias voltage $V_{BIAS2}$. The first bias voltage $V_{BIAS1}$ may be identical to or different from the second bias voltage $V_{BIAS2}$.

In this regard, the main control circuit 54 may determine a first estimated bias voltage and a second estimated bias voltage in the defined future time based on the output power $P_{OUT}$ indicated by the power indication signal 56. Accordingly, the main control circuit 54 provides the first estimated bias voltage and the second estimated bias voltage to an amplifier control circuit 52A in the first control signal 64.

In a non-limiting example, the main control circuit 54 can digitize the first estimated bias voltage and the second estimated bias voltage for communication in the first control signal 64. As such, the amplifier control circuit 52A includes a first bias DAC 70A and a second bias DAC 70B configured to convert the digitized first estimated bias voltage and the digitized second estimated bias voltage to the first estimated bias voltage and the second estimated bias voltage.

The amplifier control circuit 52A includes a first bias control circuit 74A coupled to the driver stage amplifier 84 and a second bias control circuit 74B coupled to the output stage amplifier 86. The first bias control circuit 74A is configured to generate the first bias voltage $V_{BIAS1}$ based on the first estimated bias voltage and apply the first bias voltage $V_{BIAS}$ to the driver stage amplifier 84. The second bias control circuit 74B is configured to generate the second bias voltage $V_{BIAS2}$ based on the second estimated bias voltage and apply the second bias voltage $V_{BIAS2}$ to the output stage amplifier 86.

Those skilled in the art will recognize improvements and modifications to the embodiments of the present disclosure. All such improvements and modifications are considered within the scope of the concepts disclosed herein and the claims that follow.

What is claimed is:

1. A broadband power amplifier circuit comprising:
   an amplifier circuit configured to amplify a radio frequency (RF) signal from an input power to an output power based on a bias voltage and a supply voltage;
   an amplifier control circuit coupled to the amplifier circuit; and
   a main control circuit configured to:
      receive a power indication signal indicative of the output power of the RF signal in a defined future time;
      determine an estimated bias voltage in the defined future time based on the output power indicated by the power indication signal; and
      cause the amplifier control circuit to generate the bias voltage based on the estimated bias voltage and provide the bias voltage to the amplifier circuit in the defined future time.

2. The broadband power amplifier circuit of claim 1 wherein the main control circuit is further configured to determine the estimated bias voltage to cause the amplifier circuit to operate as a class-A amplifier circuit.

3. The broadband power amplifier circuit of claim 1 wherein the main control circuit is further configured to determine the estimated bias voltage in the defined future time based on a first linear polynomial configured to be a function of the output power in the defined future time.

4. The broadband power amplifier circuit of claim 1 wherein the main control circuit is further configured to determine the estimated bias voltage in the defined future time based on a first nonlinear polynomial configured to be a function of the output power in the defined future time.

5. The broadband power amplifier circuit of claim 1 wherein:
   the amplifier circuit comprises a driver stage amplifier and an output stage amplifier coupled to the driver stage amplifier; and
   the main control circuit is further configured to:
      determine a first estimated bias voltage and a second estimated bias voltage in the defined future time based on the output power indicated by the power indication signal; and
      cause the amplifier control circuit to:
         generate the first bias voltage and the second bias voltage based on the first estimated bias voltage and the second estimated bias voltage, respectively; and
         provide the first bias voltage and the second bias voltage to the driver stage amplifier and the output stage amplifier in the defined future time, respectively.

6. The broadband power amplifier circuit of claim 5 wherein:
   the main control circuit is further configured to determine the first estimated bias voltage and the second estimated bias voltage based on a first linear polynomial and a second linear polynomial, respectively; and
   each of the first linear polynomial and the second linear polynomial is configured to be a function of the output power in the defined future time.

7. The broadband power amplifier circuit of claim 1 wherein the main control circuit is further configured to:
   determine an estimated supply voltage in the defined future time based on the output power indicated by the power indication signal; and
   cause the amplifier control circuit to generate the supply voltage based on the estimated supply voltage and provide the supply voltage to the amplifier circuit in the defined future time.

8. The broadband power amplifier circuit of claim 7 wherein the main control circuit is further configured to determine the estimated supply voltage in the defined future time based on a second linear polynomial configured to be a function of the output power in the defined future time.

9. The broadband power amplifier circuit of claim 7 wherein the main control circuit is further configured to determine the estimated supply voltage in the defined future time based on a second nonlinear polynomial configured to be a function of the output power in the defined future time.

10. The broadband power amplifier circuit of claim 1 wherein the main control circuit is further configured to:
    determine an estimated input power for the RF signal in the defined future time based on the output power indicated by the power indication signal; and
    cause the amplifier control circuit to adjust the input power of the RF signal to the estimated input power.

11. The broadband power amplifier circuit of claim 10 wherein the main control circuit is further configured to determine the estimated input power in the defined future time based on a third linear polynomial configured to be a function of the output power in the defined future time.

12. The broadband power amplifier circuit of claim 10 wherein the main control circuit is further configured to determine the estimated input power in the defined future time based on a third nonlinear polynomial configured to be a function of the output power in the defined future time.

13. The broadband power amplifier circuit of claim 1 wherein the main control circuit is further configured to:
    determine an estimated supply voltage in the defined future time based on the output power indicated by the power indication signal;
    determine an estimated input power for the RF signal in the defined future time based on the output power indicated by the power indication signal;

cause the amplifier control circuit to generate the supply voltage based on the estimated supply voltage and provide the supply voltage to the amplifier circuit; and cause the amplifier control circuit to adjust the input power of the RF signal to the estimated input power.

14. The broadband power amplifier circuit of claim 13 wherein the main control circuit is further configured to:

determine a digitized estimated bias voltage and a digitized estimated supply voltage in the defined future time based on the output power indicated by the power indication signal; and provide a first control signal indicative of the digitized estimated bias voltage, a second control signal indicative of the digitized estimated supply voltage, and a third control signal indicative of the estimated input power to the amplifier control circuit.

15. The broadband power amplifier circuit of claim 14 wherein the amplifier control circuit comprises:

a first digital-to-analog converter (DAC) configured to receive the first control signal and covert the digitized estimated bias voltage into the estimated bias voltage;

a bias control circuit coupled to the first DAC and configured to generate the bias voltage based on the estimated bias voltage and provide the bias voltage to the amplifier circuit;

a second DAC configured to receive the second control signal and convert the digitized estimated supply voltage into the estimated supply voltage;

a direct-current (DC) to direct-current (DC) (DC-DC) circuit coupled to the second DAC and configured to generate the supply voltage based on the estimated supply voltage and provide the supply voltage to the amplifier circuit; and a gain control circuit configured to receive the third control signal and adjust the input power of the RF signal to the estimated input power indicated by the third control signal.

16. The broadband power amplifier circuit of claim 15 wherein the gain control circuit is further configured to adjust the input power of the RF signal to the estimated input power in one or more iterations based on a predefined coarse gain adjustment step.

17. The broadband power amplifier circuit of claim 16 wherein the main control circuit is further configured to retrieve the predefined coarse gain adjustment step from an eFUSE and provide the predefined coarse gain adjustment step to the gain control circuit.

18. The broadband power amplifier circuit of claim 17 wherein:

the gain control circuit is further configured to:

determine a gain error between the estimated input power received from the third control signal and an actual input power of the RF signal; and provide a gain error signal indicative of the gain error to the bias control circuit; and the bias control circuit is further configured to adjust the bias voltage to compensate for the gain error.

19. A broadband power amplifier circuit comprising:

an amplifier circuit configured to amplify a radio frequency (RF) signal from an input power to an output power based on a bias voltage and a supply voltage;

an amplifier control circuit coupled to the amplifier circuit; and a main control circuit configured to:

receive a power indication signal indicative of the output power of the RF signal in a defined future time;

determine an estimated bias voltage in the defined future time based on the output power indicated by the power indication signal;

determine an estimated supply voltage in the defined future time based on the output power indicated by the power indication signal;

determine an estimated input power for the RF signal in the defined future time based on the output power indicated by the power indication signal;

cause the amplifier control circuit to generate the bias voltage based on the estimated bias voltage and provide the bias voltage to the amplifier circuit in the defined future time;

cause the amplifier control circuit to generate the supply voltage based on the estimated supply voltage and provide the supply voltage to the amplifier circuit; and cause the amplifier control circuit to adjust the input power of the RF signal to the estimated input power.

20. The broadband power amplifier circuit of claim 19 wherein the main control circuit is further configured to determine the estimated bias voltage, the estimated supply voltage, and the estimated input power in the defined future time based on a first linear polynomial, a second linear polynomial, and a third linear polynomial, respectively, each of the first linear polynomial, the second linear polynomial, and the third linear polynomial is a function of the output power in the defined future time.

* * * * *